United States Patent
Lin et al.

(10) Patent No.: US 7,830,175 B1
(45) Date of Patent: Nov. 9, 2010

(54) LOW POWER SINGLE-RAIL-INPUT VOLTAGE LEVEL SHIFTER

(75) Inventors: Hwong-Kwo Lin, Palo Alto, CA (US); Ge Yang, Santa Clara, CA (US); Charles Chew-Yuen Young, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 12/269,200

(22) Filed: Nov. 12, 2008

Related U.S. Application Data

(62) Division of application No. 11/559,155, filed on Nov. 13, 2006, now Pat. No. 7,463,065.

(51) Int. Cl.
*H03K 19/0175* (2006.01)
*H03L 5/00* (2006.01)

(52) U.S. Cl. .............................. 326/68; 326/62; 326/63; 326/80; 326/81; 327/333

(58) Field of Classification Search ............. 326/62–68, 326/82–87; 327/333
See application file for complete search history.

(56) References Cited

U.S. PATENT DOCUMENTS

| | | | |
|---|---|---|---|
| 5,969,542 | A | 10/1999 | Maley et al. |
| 7,397,273 | B1 | 7/2008 | Ng et al. |
| 2007/0035339 | A1* | 2/2007 | Park et al. .................... 327/333 |
| 2007/0290735 | A1* | 12/2007 | Ali et al. ..................... 327/333 |
| 2008/0048754 | A1* | 2/2008 | Woo et al. .................... 327/333 |

* cited by examiner

*Primary Examiner*—Rexford N Barnie
*Assistant Examiner*—Thienvu V Tran
(74) *Attorney, Agent, or Firm*—Cooley LLP

(57) ABSTRACT

An apparatus includes a single-rail input connected to a low-voltage domain and a voltage-transition circuit connected to the single-rail input. The voltage-transition circuit is configured to convert a voltage of the low-voltage domain received via the single-rail input to a voltage of the high-voltage domain.

6 Claims, 8 Drawing Sheets

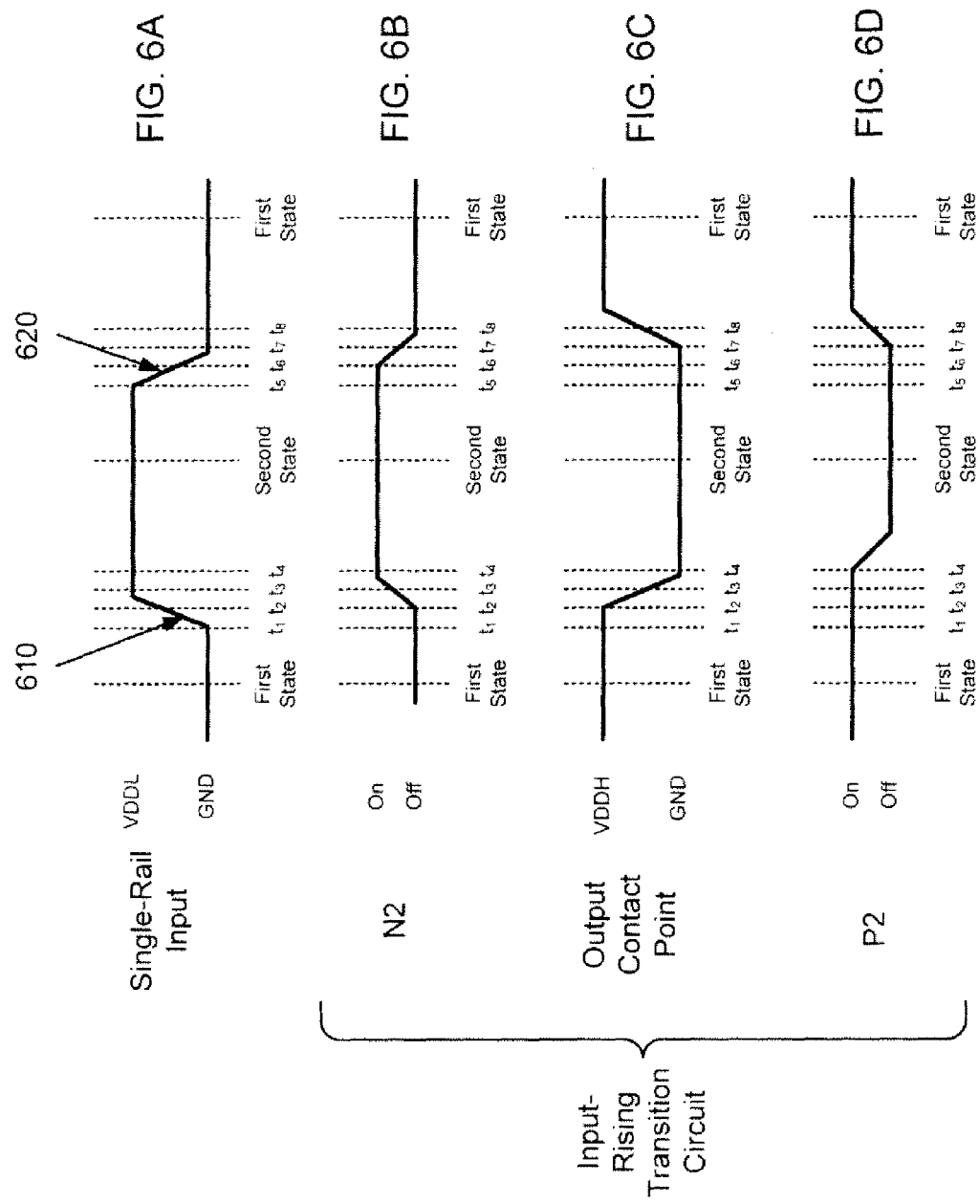

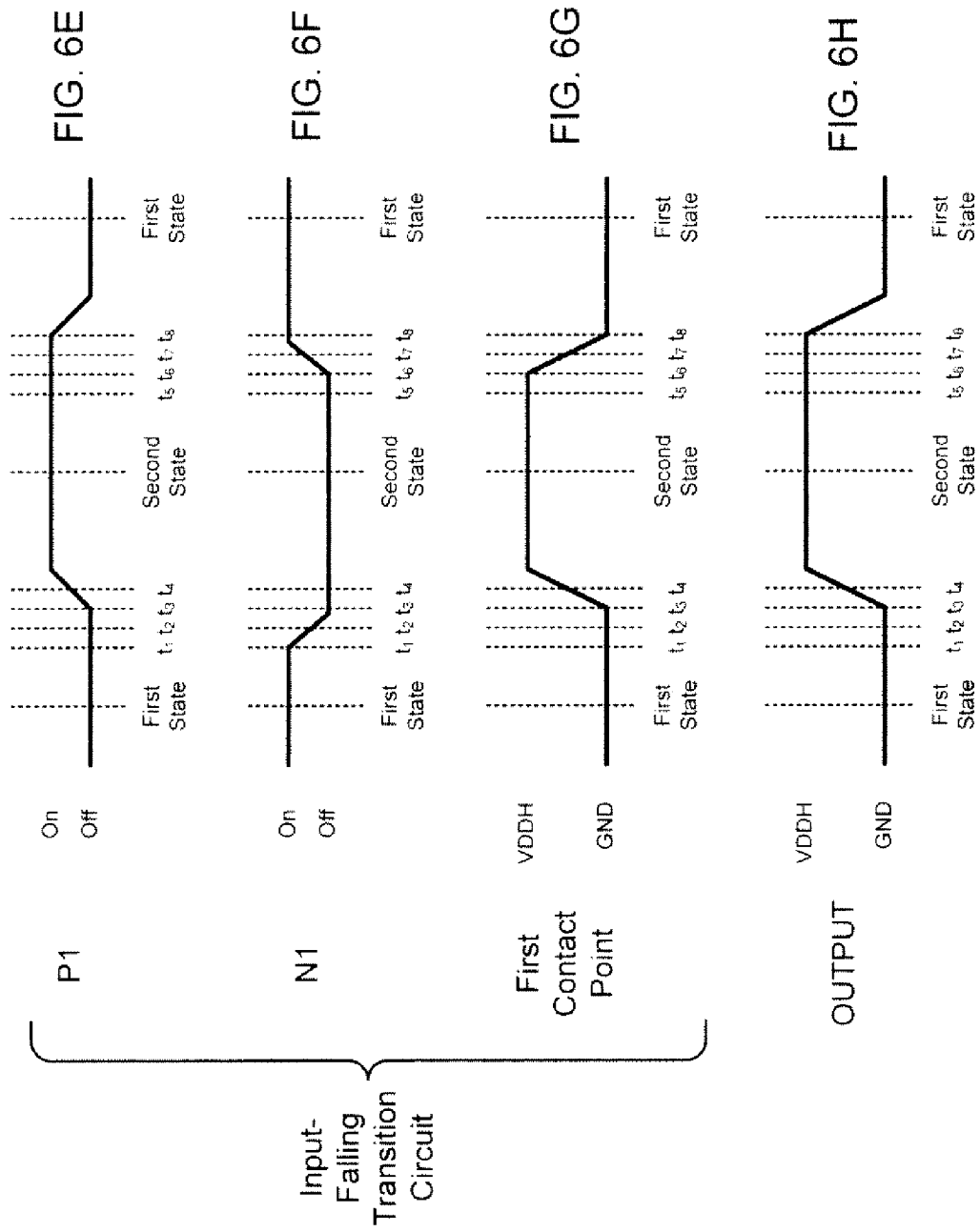

US 7,830,175 B1

LOW POWER SINGLE-RAIL-INPUT VOLTAGE LEVEL SHIFTER

CROSS REFERENCE TO RELATED APPLICATION

This is a divisional application of U.S. application Ser. No. 11/559,155, filed Nov. 13, 2006, now U.S. Pat. No. 7,463,065 which is hereby incorporated herein by reference.

BACKGROUND

The disclosed invention relates generally to a voltage level shifter, and in particular, to a voltage level shifter having a single-rail input.

The need to reduce on-chip power consumption has continued to increase as the number of transistors within chips (e.g., microprocessor, graphics chips) increases and as electronic devices that use these chips are scaled down, for example, for greater mobility. Historically, the low power consumption targets of chips have been achieved by aggressively scaling down their power supply voltages.

In an effort to further reduce overall power consumption, many chip designs also include two or more different power supply domains. Non-critical blocks within a chip, for example, can be designed to consume minimal amounts of energy by tying them to lower power supply voltages in a low power supply domain. Within the same chip, timing critical blocks that require the stability associated with a high power domain can be designed to use higher power supply voltages. Often voltage level shifters are used to convert voltages in the high power supply domain to voltages in the low power supply domain.

Known voltage level shifters, unfortunately, have several drawbacks. For example, known voltage level shifters can consume high levels of power at certain corners of operation. Also, some known voltage level shifter designs can include dual-rail inputs and/or additional inverters that not only require excessive chip real-estate, but also consume additional power. Accordingly, a need exists for improved methods and apparatus for converting power supply voltages from one voltage domain to a different voltage domain.

SUMMARY OF THE INVENTION

A voltage level shifter includes a single-rail input connected to a low-voltage domain and a voltage-transition circuit connected to the single-rail input. The voltage-transition circuit is configured to convert a voltage of the low-voltage domain received via the single-rail input to a voltage of the high-voltage domain.

In another embodiment, a voltage level shifter includes an output node and a single-rail-input node. The single-rail-input node is connected to an input-rising-transition circuit and an input-falling-transition circuit. The input-falling-transition circuit triggers a voltage of the output node to change from a VDDH voltage of a high-voltage domain to a ground voltage in response to a voltage of the single-rail-input node changing from a VDDL voltage of a low-voltage domain to the ground voltage. The input-rising-transition circuit triggers a voltage of the output node to change from the ground voltage to the VDDH voltage in response to the voltage of the single-rail-input node changing from the ground voltage to the VDDL voltage.

In another embodiment, a method includes receiving at a single-rail-input node of a voltage level shifter a power supply voltage from a low-voltage domain. The single-rail-input node is connected to an input-rising-transition circuit and an input-falling-transition circuit. The power supply voltage is converted from the low-voltage domain to a high-voltage domain using the input-rising-transition circuit and the input-falling-transition circuit.

BRIEF DESCRIPTION OF THE DRAWINGS

The present invention is described with reference to the accompanying drawings. In the drawings, identical or like reference numbers indicate identical or functionally similar elements.

FIG. 6A is a schematic graph that illustrates the behavior and timing of the single-rail input of the voltage level shifter shown in FIG. 4, according to an embodiment of the invention.

FIG. 6B is a schematic graph that illustrates the behavior and timing of the N2 transistor of the voltage level shifter shown in FIG. 4, according to an embodiment of the invention.

FIG. 6C is a schematic graph that illustrates the behavior and timing of the output contact point of the voltage level shifter shown in FIG. 4, according to an embodiment of the invention.

FIG. 6D is a schematic graph that illustrates the behavior and timing of the P2 transistor of the voltage level shifter shown in FIG. 4, according to an embodiment of the invention.

FIG. 6E is a schematic graph that illustrates the behavior and timing of the P1 transistor of the voltage level shifter shown in FIG. 4, according to an embodiment of the invention.

FIG. 6F is a schematic graph that illustrates the behavior and timing of the N1 transistor of the voltage level shifter shown in FIG. 4, according to an embodiment of the invention.

FIG. 6G is a schematic graph that illustrates the behavior and timing of the first contact point of the voltage level shifter shown in FIG. 4, according to an embodiment of the invention.

FIG. 6H is a schematic graph that illustrates the behavior and timing of the output of the voltage level shifter shown in FIG. 4, according to an embodiment of the invention.

DETAILED DESCRIPTION

Figure 1:
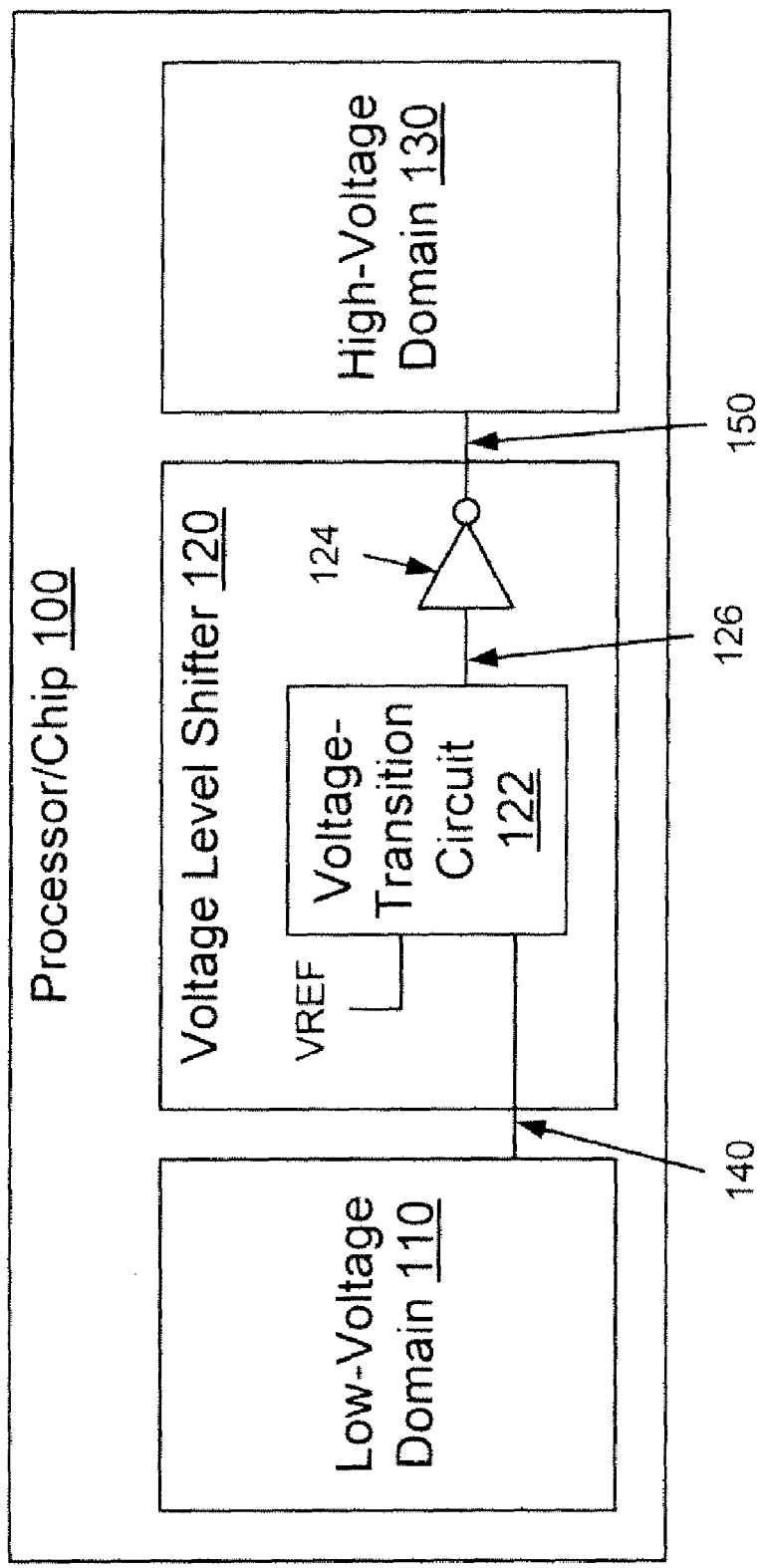
FIG. 1 is a schematic diagram of a processor/chip with a voltage level shifter configured to convert power supply voltages from a low-voltage domain to power supply voltages of a high-voltage domain, according to an embodiment of the invention.

FIG. 1 is a schematic diagram of a processor/chip 100 (e.g., graphics processor) with a voltage level shifter 120 configured to convert power supply voltages from a low-voltage domain ("VDDL domain") 110 to power supply voltages of a high-voltage domain ("VDDH domain") 130, according to an embodiment of the invention. The power supply voltages of the VDDL domain can be referred to as "VDDL power supply voltages" and the power supply voltages of the VDDH domain can be referred to as "VDDH power supply voltages." In many embodiments, the VDDL power supply voltages include only a rail voltage (or power supply voltage) referred to as VDDL and a ground voltage. The VDDH power supply voltages can also include a rail voltage (or a power supply voltage) referred to as VDDH and a ground voltage.

Specifically, the voltage level shifter 120 can be configured to convert VDDL to VDDH, and the ground voltage of the VDDL domain 130 ("low-domain ground voltage") to the ground voltage of the VDDH domain 110 ("high-domain ground voltage"). The voltage level shifter 120 converts the low-domain ground voltage to the high-domain ground voltage when in a first state and converts VDDL to VDDH when in a second state. Although the low-domain ground voltage and the high-domain ground voltage are a common ground voltage ("GND" or "ground") in this embodiment, in some embodiments the low-domain ground voltage and the high-domain ground voltage can be different voltages.

The voltage level shifter 120 can be triggered to change from the first state to the second state when the VDDL power supply voltage changes from ground to VDDL. Likewise, the voltage level shifter 120 can be triggered to change from the second state to the first state when the VDDL power supply voltage changes from VDDL to ground. Note that the designations of the first state and second state are arbitrary designations that do not imply an order.

Although FIG. 1 shows that the processor/chip 100 has only a single voltage level shifter 120 converting a single low-voltage domain 110 to a single high voltage domain 130, in some embodiments of the invention, the processor/chip 100 can be designed to include more than one voltage level shifter 120, low-voltage domain 110, and/or high voltage domain 130. For example, multiple voltage level shifters of different types (e.g., different voltage shifting capability) can be used to convert voltages between different low voltage domains and/or high voltage domains.

The power supply voltages within the VDDL and VDDH domains can vary significantly depending on the application and the processing technology employed. An example of voltages for the VDDL and VDDH domains within a typical processing technology are VDDL of 0.8 V±10% and VDDH of 1V±10%. Exemplary threshold voltages for n-type transistors that correspond with these voltage domains can be between 200 mV to 350 mV and exemplary threshold voltages for p-type transistors for these voltage domains can be between −350 mV to −200 mV. The variation (e.g., ranges) in the voltage domains and threshold voltages can be caused by, for example, processing variation, temperature changes, etc.

The exemplary processing technology described above illustrates that the variations (e.g., threshold voltage variations and domain voltage variations) are significant given the low domain voltages. The exemplary processing technology described above also illustrates that the magnitudes of the threshold voltages can be smaller than the magnitude of the difference between the domain voltages. This overlap in magnitudes can be problematic for known voltage level shifter circuits.

As shown in FIG. 1, the voltage level shifter 120 has a single-rail input 140 configured to receive the VDDL power supply voltages from the VDDL domain 110. The single-rail input 140 of the voltage level shifter 120 is a genuine single-rail input that is not, for example, split and inverted after being received at the voltage level shifter 120 to create complementary VDDL power supply voltages.

Figure 2:
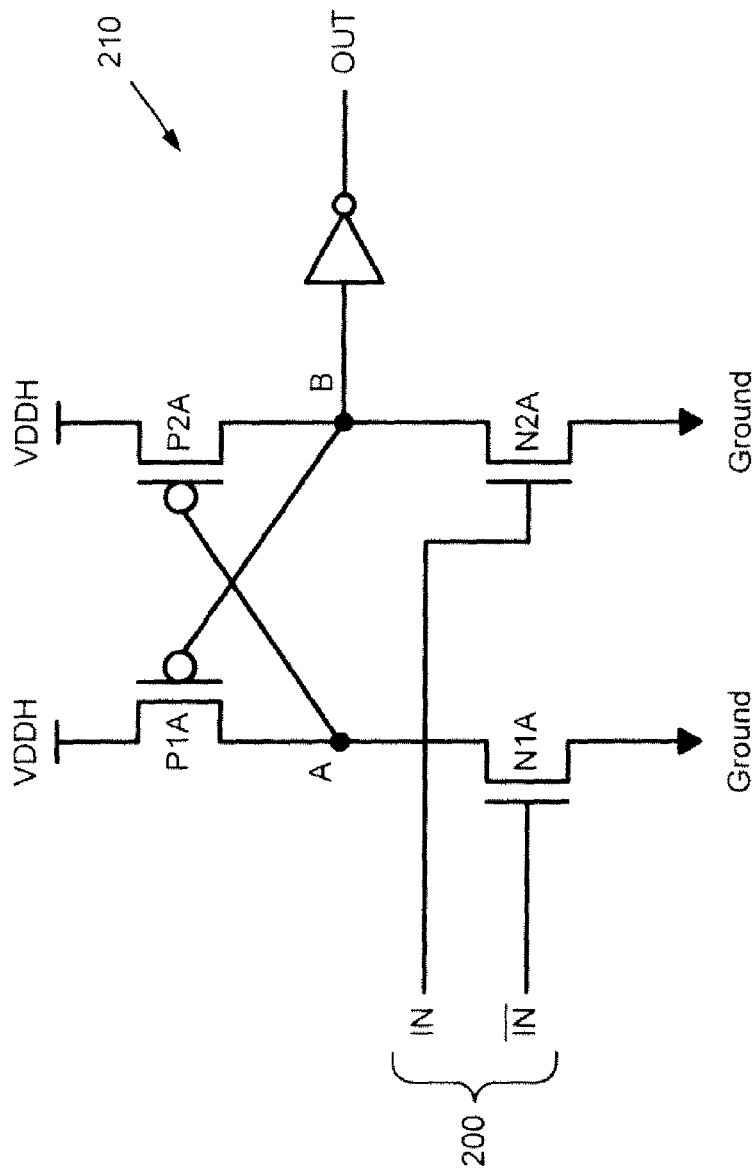
FIG. 2 is a circuit diagram of a known voltage level shifter with a dual-rail input.

The single-rail input 140 of the voltage level shifter 120, according to the present invention, can be contrasted with a dual-rail input signal 200 of a known voltage level shifter 210 shown in FIG. 2. The voltage level shifter 210 receives a power supply voltage IN and a complementary power supply voltage IN bar (complement of the IN signal) as dual-rail input voltages 200. The voltage level shifter 210 has a single output signal OUT. The voltage level shifter 210 is configured to receive the dual-rail input voltages 200 so that the voltage level shifter 210 can convert the power supply voltage IN to a different voltage domain (e.g., convert VDDL of a VDDL domain to VDDH of a VDDH domain).

Referring back to FIG. 1, the VDDL power supply voltages when converted by the voltage level shifter 120 to the VDDH domain can be output as VDDH power supply voltages on an output 150 of the voltage level shifter 120. Specifically, the VDDL power supply voltages received on the single-rail input 140 can be converted using a voltage-transition circuit 122 and an inverter 124 of the voltage level shifter 120. An output 126 of the voltage-transition circuit 122 is inverted when received on an input of the inverter 124. Although not shown in FIG. 1, the voltage level shifter 120 can be powered by power supply voltages such as VDDH and ground.

The voltage level shifter 120 also receives a reference voltage signal ("VREF"). In some embodiments, the voltage level shifter 120 can be designed so that VREF can be connected to a high impedance node of the voltage-transition circuit 122 (e.g., a gate of a transistor). This can enable the VREF signal to be connected to hundreds of voltage level shifters 120 distributed within the processor/chip 100 with very little or no consumption of power due to the VREF signal connection.

The voltage level shifter 120 can also be configured so that the voltage level shifter 120 consumes very little power in all corners of operation within the first and second states. The power consumed by the voltage level shifter 120 can be substantially less than the power that is consumed, for example, during switching from the first state to the second state. In some embodiments, the power consumed (e.g., operating power) during the first state is substantially similar to the power consumed during the second state. In some embodiments, the current consumed can be on the order of the sub-threshold leakage currents of an individual transistor component within the voltage level shifter 120.

Figure 3:
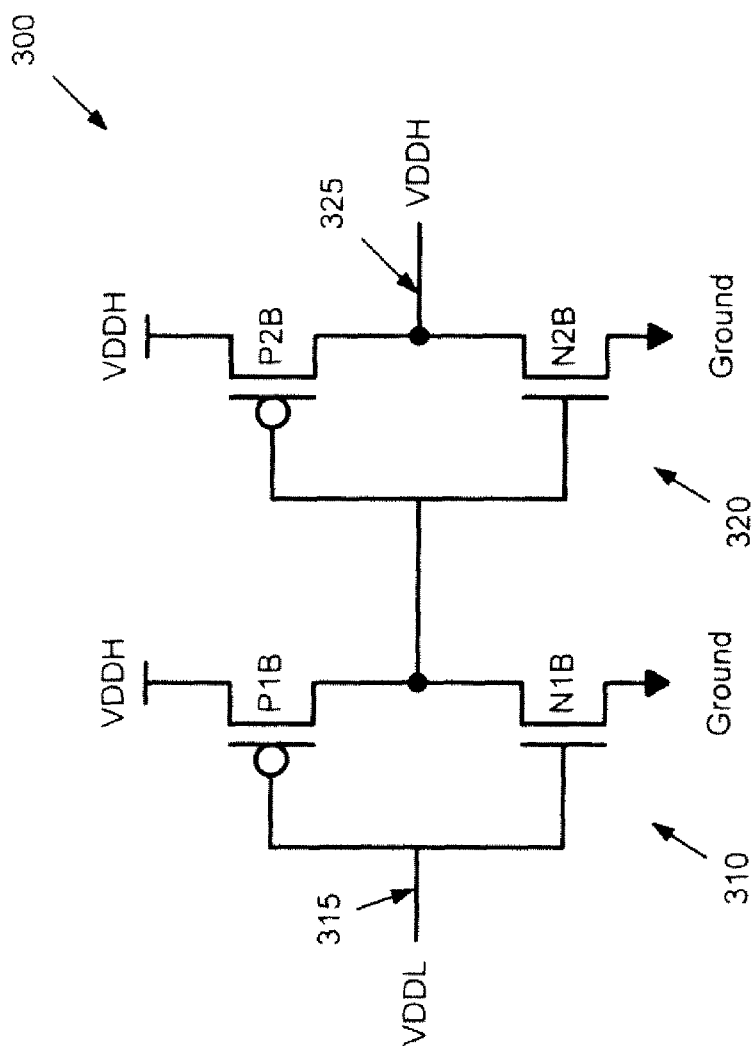
FIG. 3 is a circuit diagram of a known dual-buffer voltage level shifter.

The power consumed by the voltage level shifter 120, according to some embodiments of this invention, can be significantly lower than the power consumed by, for example, a known dual-buffer voltage level shifter 300 shown in FIG. 3. The dual-buffer voltage level shifter 300 shown in FIG. 3 includes a first buffer 310 with transistors P1B and N1B and a second buffer 320 with transistors P2B and N2B. The dual-buffer voltage level shifter 300 is configured to convert a VDDL power supply voltage (from a VDDL domain) received at input 315 to a VDDH power supply voltage (from a VDDH domain) that can be output at output 325, and vice versa.

When the dual-buffer voltage level shifter 300 is converting VDDL to VDDH, transistor N1B can be on and P113 can be partially or completely on, resulting in a high power direct current path between VDDH and ground. For example, in a typical application, VDDL can be 0.8V±10%, VDDH can be 1V±10%, and a threshold voltage of transistor P1B can be 275 mV±50 mV (in absolute terms). If, as a result of variation from processing for example, VDDL=0.72 V, VDDH=1.1 V, and the threshold voltage of transistor P1B=225 mV, P1B will be completely on when the voltage of the input is VDDL because the difference between VDDL and VDDH (380 mV) will exceed the 225 mV threshold voltage.

In contrast to the dual-buffer voltage level shifter 300, the voltage-transition circuit 122 within the voltage level shifter 120 shown in FIG. 1 can include a blocking transistor that substantially reduces the overall power consumed by the voltage level shifter 120, even given the transistor and power supply scenario described above. Specifically, the blocking transistor can be included in the voltage-transition circuit 122 such that the blocking transistor prevents or substantially prevents a direct current path from forming between, for example, VDDH and ground when converting, for example, VDDL to VDDH.

Figure 4:
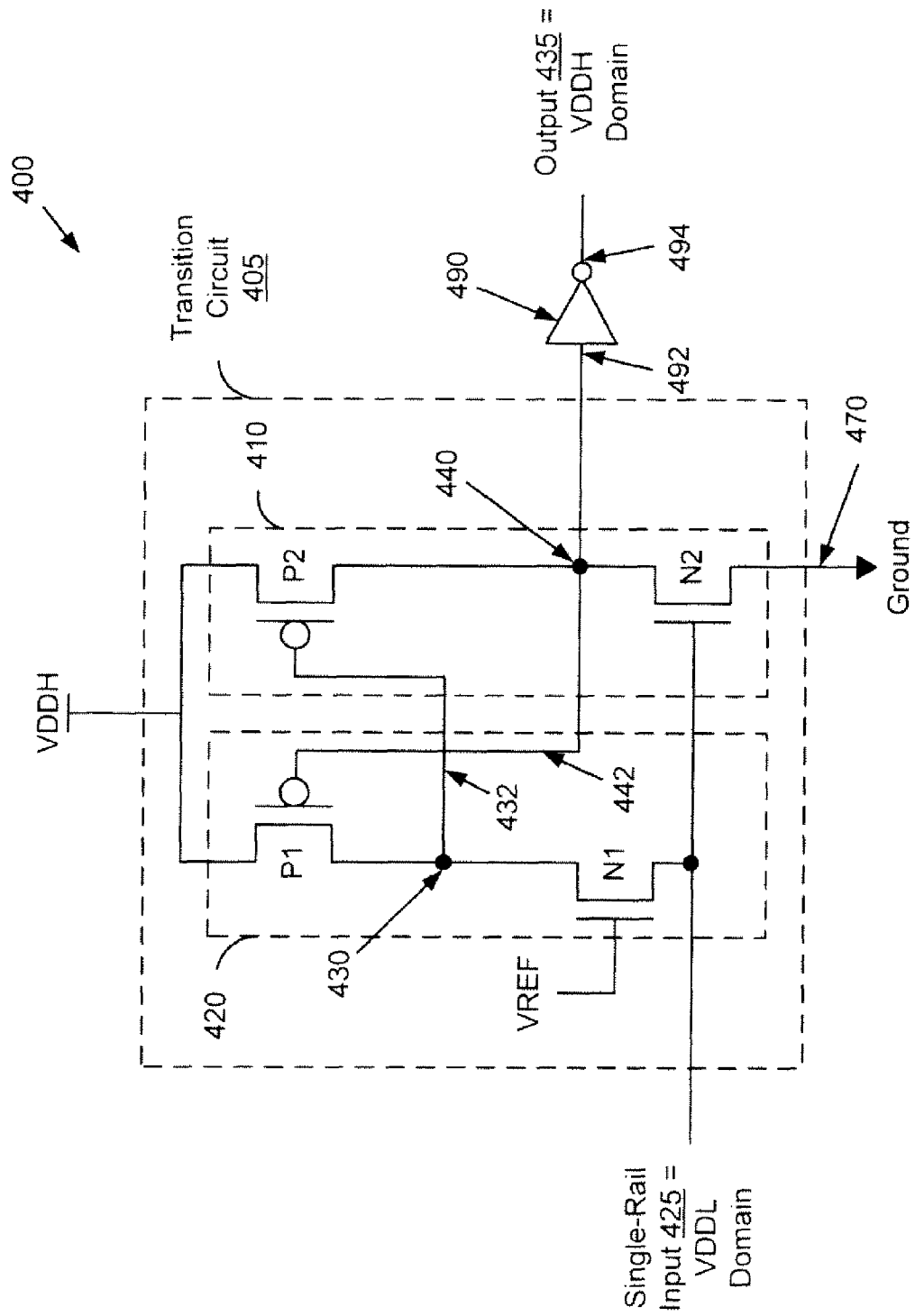
FIG. 4 is a circuit diagram of a voltage level shifter, according to an embodiment of the invention.

FIG. 4 is a circuit diagram of a voltage level shifter 400, according to an embodiment of the invention. The voltage level shifter 400 can be configured to convert VDDL power supply voltages of a VDDL domain to VDDH power supply voltages of a VDDH domain. The voltage level shifter 400 includes a voltage-transition circuit 405 with an output contact point 440 that can be connected to an input 492 of an inverter 490. An output 494 of the inverter 490 can be an output 435 of the voltage level shifter 400.

The voltage-transition circuit 405 includes an input-rising-transition circuit 410 and an input-falling-transition circuit 420. In this embodiment, a single-rail input 425 of the voltage-transition circuit 405 (which is also an input of the voltage level shifter 400) can be connected to the input-rising-transition circuit 410 and connected to the input-falling-transition circuit 420. The VDDL power supply voltages of the VDDL domain can be received on the single-rail input 425. The VDDL power supply voltages, when converted by the voltage level shifter 400 to the VDDH domain, can be output as VDDH power supply voltages on the output 435 of the voltage level shifter 400. The single-rail input 425 can be referred to as a single-rail-input node or input node and the output 435 can be referred to as an output node.

The voltage-transition circuit 405 of the voltage level shifter 400 can be configured to change from a first state to a second state, and vice versa, when the VDDL power supply voltage on the single-rail input 425 of the voltage level shifter 400 changes (e.g., from VDDL to the ground voltage). Specifically, the input-rising-transition circuit 410 of the voltage-transition circuit 405 triggers the change from the first state to the second state when the VDDL power supply voltage on the single-rail input 425 rises from ground to VDDL. The input-falling-transition circuit 420 of the voltage-transition circuit 405 triggers the change from the second state to the first state when the VDDL power supply voltage on the single-rail input 425 falls from VDDL to ground.

The input-falling-transition circuit 420 includes an n-type transistor N1 with a drain connected to a drain of a p-type transistor P1 at a first contact point 430. A source of the P1 transistor is connected to VDDH. The source of the N1 transistor is connected to the single-rail input 425 and the gate of the N1 transistor is connected to a reference voltage VREF (also referred to as a reference voltage input node).

The input-rising-transition circuit 410 includes an n-type transistor N2 with a gate connected to the single-rail input 425 and a source 470 connected to a ground voltage (also can be referred to as a ground voltage node). The N2 transistor has a drain connected to the output contact point 440. The output contact point 440 is connected to the gate the P1 transistor as a feedback connection 442 that can be referred to as an input-falling feedback connection.

A p-type transistor P2 has a drain connected to the output contact point 440 and a gate connected to the first contact point 430. A source of the P2 transistor is connected to VDDH. The connection between the gate of the P2 transistor and the input contact point 430 is a feedback connection 432 that can be referred to as an input-rising feedback connection. Transistor P2 is a blocking transistor that prevents or substantially prevents a current path from forming between VDDH and ground when the N2 transistor is on. The N2 transistor can be on when a voltage of the single-rail input 425 of the voltage-transition circuit 405 is, for example, VDDL.

Figure 5:
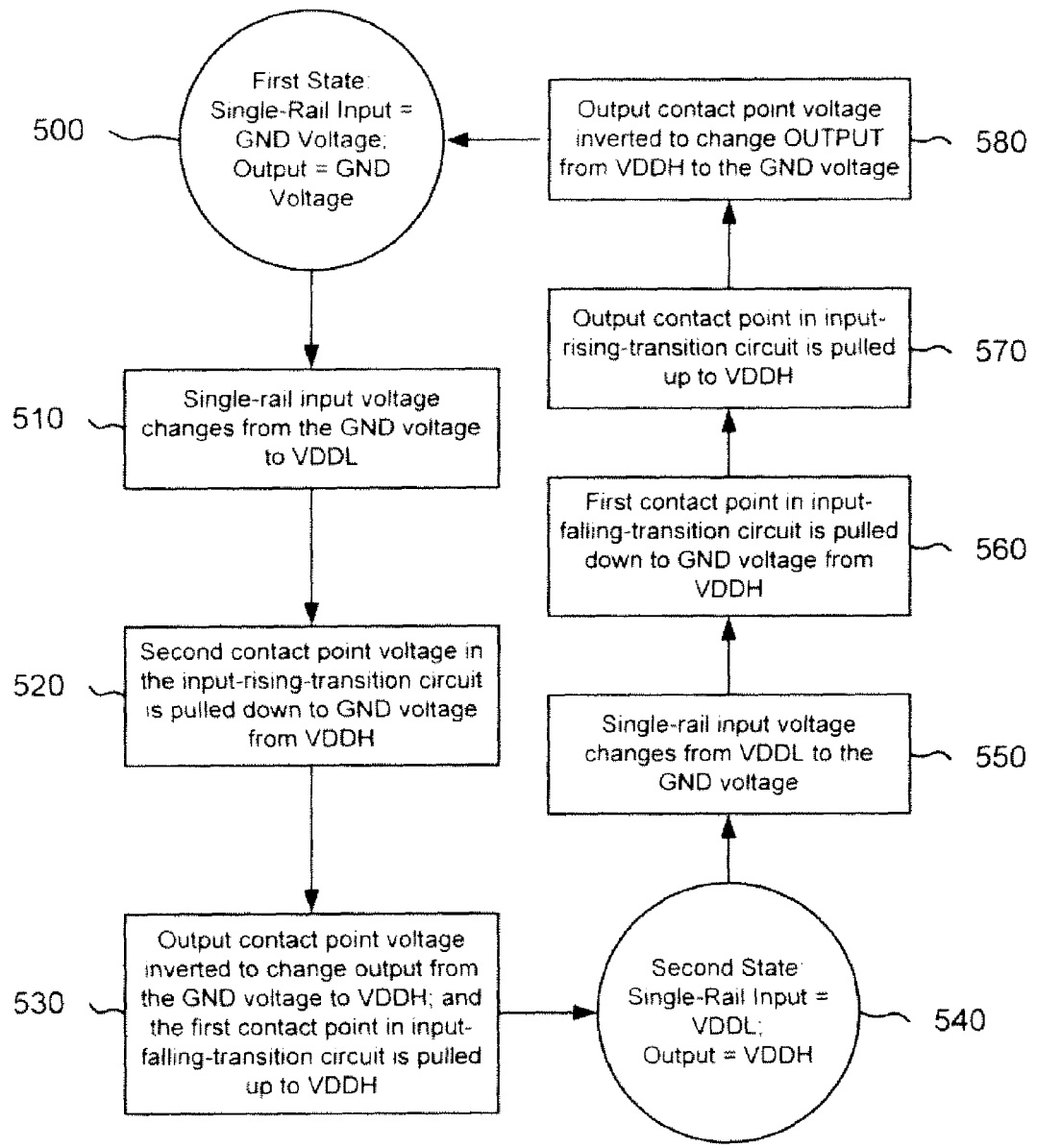
FIG. 5 is a flow chart that illustrates the operation of the voltage level shifter shown in FIG. 4, according to an embodiment of the invention.

FIG. 5 is a flow chart that illustrates the operation of the voltage level shifter 400 shown in FIG. 4, according to an embodiment of the invention. The flow chart includes a description of events that trigger and/or occur when the voltage level shifter 400 changes from the first state to the second state, and vice versa.

The flow chart shows that when the voltage level shifter 400 is in the first state (block 500), a voltage of the single-rail input 425 and a voltage of the output 435 are the ground voltage. Also, when in the first state, the voltage of the output contact point 440 of the voltage-transition circuit 405 is VDDH and the voltage of the first contact point 430 in the input-falling-transition circuit 420 is the same as that of the single-rail input 425 voltage (in this case the voltage of the single-rail input 425 is the ground voltage). The voltage level shifter 400 remains in the first state (block 500) until the voltage of the single-rail input 425 changes from ground to, for example, VDDL.

A change from the first state to the second state is triggered when the voltage of the single-rail input 425 changes (rises) from ground to VDDL (block 510). The change in voltage from ground to VDDL causes the output contact point 440 in the input-rising-transition circuit 410 to be pulled down to ground from VDDH (block 520).

The change in the voltage of the output contact point 440 triggers a change in the voltage of the first contact point 430 in the input-falling-transition circuit 420 to be pulled up to VDDH (block 530). Also, the ground voltage at the output contact point 440 is inverted by the inverter 490 to change the output 435 voltage from ground to VDDH (block 530). The change in the output 435 voltage to VDDH completes the transition from the first state (block 500) to the second state (block 540).

When the voltage level shifter 400 is in the second state (block 540), the voltage of the single-rail input 425 is VDDL and the voltage of the output 435 is VDDH. In other words, when in the second state, VDDL is being converted by the voltage level shifter 400 to VDDH in the VDDH domain. Also, when in the first state, the voltage of the output contact point 440 of the voltage-transition circuit 405 is the ground voltage and the voltage of the first contact point 430 in the input-falling-transition circuit 420 is VDDH. The voltage level shifter 400 remains in the second state (block 540) until the voltage of the single-rail input 425 changes, for example, from VDDL to the ground voltage.

A change from the second state to the first state is triggered when the voltage of the single-rail input 425 changes (falls) from VDDL to the ground voltage (block 550). The change in voltage from VDDL to the ground voltage causes the first contact point 430 in the input-falling-transition circuit 420 to be pulled down to the ground voltage from VDDH (block 560).

The change in the first contact point 430 voltage to the ground voltage triggers a change in the output contact point 440 voltage in the input-falling-transition circuit 420 to be pulled up to VDDH (block 570). The output contact point 440 of the voltage-transition circuit 405 is stabilized at VDDH when the first contact point 430 is the ground voltage and the voltage of the single-rail input 425 is the ground voltage.

VDDH at the output contact point 440 is then inverted by the inverter 490 to change the output 435 voltage from VDDH to the ground voltage (block 580). The change in the output 435 voltage to the ground voltage completes the transition from the second state (block 550) to the first state (block 500).

FIGS. 6A through 6H are schematic graphs that are illustrative of the behavior and timing of the transistors and nodes of the voltage level shifter 400 shown in FIG. 4. Specifically, the graphs in FIGS. 6A through 6H illustrate the timing of changes (e.g., voltage changes) that can occur when the voltage level shifter 400 changes from the first state to the second state, and vice versa.

The changes in the voltage level shifter 400 from the first state to the second state and from the second state to the first state are triggered by the rising 610 and falling 620 voltage changes, respectively, of the single-rail input 425 as shown in FIG. 6A. FIGS. 6B, 6C, and 6D are related to transistors and/or nodes of the input-rising-transition circuit 410 and FIGS. 6E, 6F, and 6G are related to transistors and/or nodes of the input-falling-transition circuit 420. A person of ordinary skill in the art should appreciate that the behavior and timing of the transistors and nodes can vary depending upon, for example, transistor sizing, threshold voltages, process variation, VDDH and VDDL power supply voltages, etc.

FIGS. 6A and 6H, respectively, show that the single-rail input 425 voltage and the output 435 voltage are the ground voltage ("GND") when the voltage level shifter 400 is in the first state. FIGS. 6A and 6H also show, respectively, that the single-rail input 425 voltage is VDDL and the output 435 voltage is VDDH when the voltage level shifter 400 is in the second state. The voltage of the output contact point 440 of the voltage-transition circuit 405 is VDDH in the first state and the ground voltage in the second state as shown in FIG. 6C.

The voltage level shifter 400 is designed such that the rising voltage 610 of the single-rail input 425 of the voltage level shifter 400 starting at time $t_1$ as shown in FIG. 6A causes transistor N2 of the input-rising-transition circuit 410 to turn on starting at time $t_1$ as shown in FIG. 6B. The rising voltage 610 of the single-rail input 425 of the voltage level shifter 400 as shown in FIG. 6A also causes transistor N1 to turn off starting at time $t_2$ as shown in FIG. 6F.

Transistor N1 is designed with a threshold voltage that is greater than the difference between the reference voltage (VREF) and VDDL (single-rail input voltage) so that transistor N1 will turn off in response to the rising voltage 610. Transistor N2 is designed with a threshold voltage that is less than the difference between VDDL and the GND voltage so that transistor N2 will turn on in response to the rising voltage 610. Transistor N2 is also sized so that N2 will have the strength to pull the voltage of the output contact point 440 from VDDH down to the GND voltage starting at time $t_2$ as shown in FIG. 6C.

As shown in FIG. 6C, the falling voltage of the output contact point 440 (which is connected to the gate of the P1 transistor) causes the P1 transistor to turn on and pull the first contact point 430 from the GND voltage up to VDDH. The changes, starting at time $t_3$, in the P1 transistor and the contact point 430 are shown in FIGS. 6E and 6G, respectively. Also at time $t_3$, the falling voltage of the output contact point 440, as shown in FIG. 6C, is inverted by the inverter 490 so that the output 435 changes from the GND voltage to VDDH as shown in FIG. 6H.

The rising voltage of the first contact point 430, as shown in FIG. 6G, triggers the P2 transistor to turn off starting at time $t_4$ as shown in FIG. 6D. The switching of the P2 transistor (blocking transistor) from an on state to an off state completes the transition of the voltage level shifter 400 from the first state to the second state. Because the gate of the P2 transistor is tied to the first contact point 430 via input-rising feedback connection 432, the voltage of the gate is pulled up to VDDH. The P2 transistor will be off and will block current through the input-rising-transition circuit 410 in the second state even if, for example, VDDL and VDDH are relatively far apart and the threshold voltage of the P2 transistor is quite small as a result of, for example, variation from processing. Once in the second state, the voltage level shifter 400 remains in the second state until the voltage of the single-rail input 425 changes by falling 620 from VDDL to the GND voltage.

The voltage level shifter 400 is designed such that the falling voltage 620 of the single-rail input 425 of the voltage level shifter 400 starting at time $t_5$, as shown in FIG. 6A, causes transistor N1 of the input-falling-transition circuit 430 to turn on as shown in FIG. 6F. The falling voltage 620 of the single-rail input 425 of the voltage level shifter 400 starting at time $t_5$, as shown in FIG. 6A, also causes transistor N2 to turn off starting at time $t_6$ as shown in FIG. 6B.

Transistor N1 is designed with a threshold voltage that is less than the difference between VDDL and the GND voltage so that transistor N1 will turn on in response to the falling voltage 620. Transistor N1 is sized so that N1 will have the strength to pull the voltage of the first contact point 430 from VDDH down to the GND voltage starting at time $t_6$ as shown in FIG. 6G. Transistor P1 can also be designed as a weak pull-up device so that transistor N1 can pull down the voltage of the first contact point 430 (as shown in FIG. 6G) when the voltage of the single-rail input falls 620 (as shown in FIG. 6A).

The falling voltage of the first contact point 430, as shown in FIG. 6G, (which is connected to the gate of the P2 transistor) causes the P2 transistor to turn on and pull the output contact point 440 from the GND voltage up to VDDH starting at time $t_7$ as shown in FIGS. 6D and 6C, respectively.

The rising voltage of the output contact point 440 causes the P1 transistor to turn off starting at time $t_8$ as shown in FIG. 6E. The rising voltage of the output contact point 440, as shown in FIG. 6C, is inverted by the inverter 490 so that the output 435 changes from VDDH to the GND voltage as shown in FIG. 6H. The change of the output 435 voltage completes the transition of the voltage level shifter 400 from the second state to the first state. Once in the first state, the voltage level shifter 400 remains in the first state until the voltage of the single-rail input 425 rises 610 from the GND voltage to VDDL.

Figure 7:
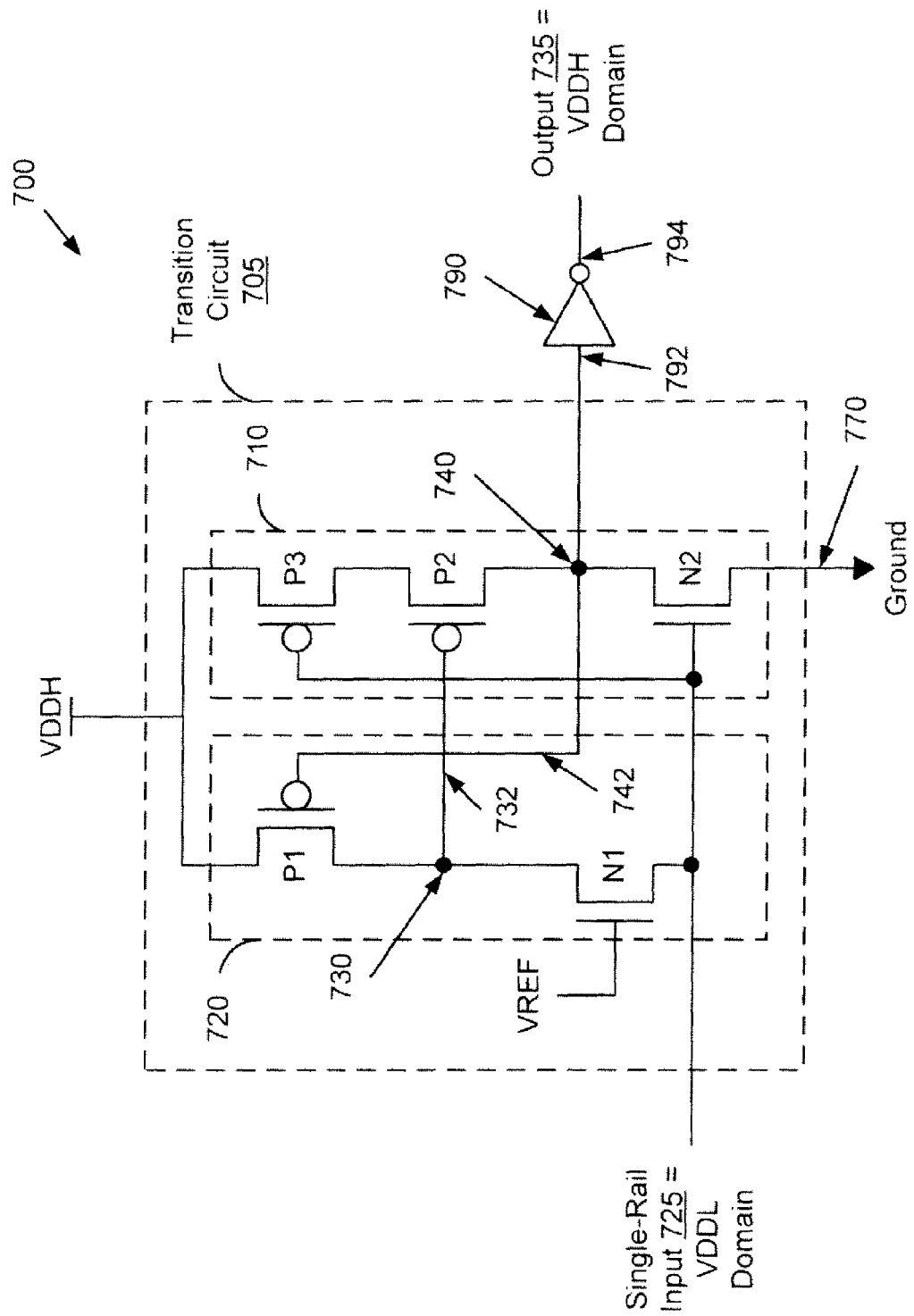
FIG. 7 is a circuit diagram of a voltage level shifter, according to an embodiment of the invention.

FIG. 7 is a circuit diagram of a voltage level shifter 700, according to an embodiment of the invention. In addition to all of the transistors and nodes included in the voltage level shifter 400 as shown in FIG. 4, the voltage level shifter 700 shown in FIG. 7 includes a p-type transistor P3 that operates as a partially-complementary-control transistor. Transistor P3, which is connected in series with the P2 transistor, has a drain connected to the source of the P2 transistor, a source connected to VDDH, and a gate connected to single-rail input 725.

Many aspects of the basic circuitry and operation of the voltage level shifter 700, in this embodiment, are similar to and/or identical to that of the voltage level shifter 400 shown in FIG. 4. For example, the voltage level shifter 700 includes a single-rail input 725 and a voltage-transition circuit 705 that has an input-rising-transition circuit 710 and an input-falling-transition circuit 720. Also, the voltage-transition circuit 705 of the voltage level shifter 700 is configured to change from a first state to a second state, and vice versa, when the VDDL power supply voltage on the single-rail input 725 of the voltage level shifter 700 changes (e.g., from VDDL to a ground voltage).

In some embodiments, the P3 transistor can be designed so that the P3 transistor is fully on in both the first and second states. For example, in many embodiments, the minimum difference between the gate and source of the P3 transistor in the first and second states will be the difference between VDDL (the voltage from the single-rail input 725 at the gate of transistor P3) and VDDH (the voltage at the source of transistor P3). If the threshold voltage of the P3 transistor is designed to be less than this minimum difference (in absolute value tennis) in the first and second states, the P3 transistor will always be on.

In some embodiments, the P3 transistor can be designed so that the P3 transistor is fully on in the first state and partially on in the second state. This situation can occur when the threshold voltage of the P3 transistor is close to the difference (in absolute value terms) between the voltage of the single-rail input 725 (VDDL) and VDDH in the second state.

The addition of the P3 transistor can be used to enhance the performance of the voltage level shifter 700. For example, depending on the threshold voltage of P3 and the difference between VDDH and VDDL, the P3 transistor can turn off when the voltage of the single-rail input 725 changes from the ground voltage to VDDL. This can enable the N2 transistor to quickly pull the output contact point 740 down to ground because there will be little or no current path between the P2 transistor, the P3 transistor, and the N2 transistor. Thus, the addition of the P3 transistor will enable the input-transition circuit 710 to switch quickly (e.g., faster than without the P3 transistor) even with a reduction in the size of the N2 transistor. A reduction in the size of the N2 transistor and faster switching speeds can result in a decrease in the overall switching power of the voltage level shifter 700.

In conclusion, the present invention provides, among other things, apparatus and methods for converting power supply voltages from one voltage domain to power supply voltages in a different voltage domain. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A voltage level shifter, comprising:
    a single-rail input connected to a low-voltage domain; and
    a voltage-transition circuit connected to the single-rail input, the voltage-transition circuit being configured to convert a voltage of the low-voltage domain received via the single-rail input to a voltage of a high-voltage domain;
    wherein the voltage-transition circuit includes an input-falling-transition circuit, the input-falling-transition circuit comprising:
        a first p-type transistor; and
        a first n-type transistor having a drain connected to a drain of the first p-type transistor at an input contact point, the first n-type transistor having a source connected to the single-rail input, the first n-type transistor having a gate connected to a reference voltage, the first p-type transistor having a source connected to a VDDH voltage of the high-voltage domain;
    wherein the voltage-transition circuit includes an input-rising-transition circuit, the input-rising-transition circuit comprising:
        a second n-type transistor having a gate connected to the single-rail input, the second n-type transistor having a source connected to a ground voltage, the second n-type transistor having a drain connected to an output contact point, the output contact point being connected to a gate of the first p-type transistor of the input-falling-transition circuit;
        a second p-type transistor having a drain connected to the output contact point, the second p-type transistor having a gate connected to the input contact point of the input-falling-transition circuit; and
        a third p-type transistor connected in series with the second p-type transistor, the third p-type transistor having a drain connected to a source of the second p-type transistor, the third p-type transistor having a source connected to the VDDH voltage of the high-voltage domain, the third p-type transistor having a gate connected to the single-rail input.

2. The voltage level shifter of claim 1, wherein the output contact point is connected to an input of an inverter, and an output of the inverter is an output node.

3. The voltage level shifter of claim 1, wherein the first n-type transistor has a threshold voltage, the reference voltage is defined such that a difference between the reference voltage and a voltage of the single-rail input is at least one of less than the threshold voltage when the voltage of the single-rail input is a VDDL voltage of the low-voltage domain or greater than the threshold voltage when a voltage of the output contact point is the VDDH voltage of the high-voltage domain.

4. The voltage level shifter of claim 1, wherein the second n-type transistor is sized such that a change in a voltage of the single-rail input from a ground voltage to a VDDL voltage of the low-voltage domain triggers a voltage of the output contact point to change from the VDDH voltage of the high-voltage domain to the ground voltage.

5. The voltage level shifter of claim 1, wherein the third p-type transistor is at least partially on when a voltage of the single-rail input is a VDDL voltage of the low-voltage domain.

6. The voltage level shifter of claim 1, wherein the second p-type transistor corresponds to a p-type blocking transistor that prevents a substantially high current path from forming between the VDDH voltage of the high-voltage domain and a ground voltage when the voltage of the single-rail input is a VDDL voltage.

* * * * *